United States Patent
Kang et al.

(10) Patent No.: US 8,705,302 B2
(45) Date of Patent: Apr. 22, 2014

(54) SEMICONDUCTOR MEMORY DEVICES HAVING SELF-REFRESH CAPABILITY

(75) Inventors: Yong Hoon Kang, Seoul (KR); Joo Young Hwang, Suwon-si (KR); Jae Young Choi, Hwaseong-si (KR); Young Joon Choi, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 257 days.

(21) Appl. No.: 13/241,977

(22) Filed: Sep. 23, 2011

(65) Prior Publication Data
US 2012/0075947 A1  Mar. 29, 2012

(30) Foreign Application Priority Data

Sep. 24, 2010 (KR) .................. 10-2010-0092866
Nov. 8, 2010 (KR) .................. 10-2010-0110588

(51) Int. Cl.
*G11C 7/00* (2006.01)

(52) U.S. Cl.
USPC .................. 365/203; 365/222; 365/233.12

(58) Field of Classification Search
USPC .............. 365/222, 203, 233.11, 233.12, 235, 365/238.5, 185.23, 185.25
See application file for complete search history.

(56) References Cited

U.S. PATENT DOCUMENTS

| | | | |
|---|---|---|---|
| 5,623,451 A | 4/1997 | Kawagoe | |
| 7,158,433 B2 | 1/2007 | Riho et al. | |
| 7,180,806 B2 | 2/2007 | Ikeda et al. | |
| 2003/0086316 A1* | 5/2003 | Kurjanowicz et al. | 365/200 |
| 2005/0108460 A1* | 5/2005 | David | 711/5 |
| 2006/0133173 A1* | 6/2006 | Jain et al. | 365/222 |
| 2008/0144417 A1* | 6/2008 | Eguchi et al. | 365/222 |
| 2009/0225623 A1* | 9/2009 | Walker | 365/238.5 |

FOREIGN PATENT DOCUMENTS

| | | |
|---|---|---|
| JP | 2004-273029 | 9/2004 |
| JP | 2008-152841 | 7/2008 |
| JP | 2009-059412 | 3/2009 |
| KR | 1019990013963 | 2/1999 |
| KR | 1020050078242 A | 8/2005 |
| KR | 1020080056089 A | 6/2008 |

* cited by examiner

*Primary Examiner* — Son Dinh
*Assistant Examiner* — Hien Nguyen
(74) *Attorney, Agent, or Firm* — Myers Bigel Sibley & Sajovec, P.A.

(57) ABSTRACT

A semiconductor memory device includes at least one memory bank including a plurality of memory cells and a self-refresh controller configured to generate a refresh address and to output a row address for a page to be refreshed based on the refresh address. The semiconductor memory device drives the at least one memory bank based on the row address and selectively refreshes pages in the at least one memory bank in response to the row address.

19 Claims, 16 Drawing Sheets

SEMICONDUCTOR MEMORY DEVICES HAVING SELF-REFRESH CAPABILITY

CROSS-REFERENCE TO RELATED APPLICATIONS

This application claims priority under 35 U.S.C. §119(a) from Korean Patent Application No. 10-2010-0092866 filed on Sep. 24, 2010 and No. 10-2010-0110588 filed on Nov. 8, 2010, the disclosure of which is hereby incorporated by reference in its entirety.

BACKGROUND

The present invention relates to semiconductor memory devices and refresh methods thereof, and more particularly, to semiconductor memory devices with reduced self-refresh power consumption and refresh methods thereof.

Some mobile electronic products, such as smart phones, require large-capacity dynamic random access memory (DRAM). Generally, in semiconductor memory devices such as DRAM, data stored in a memory cell may be changed due to leakage current. Accordingly, a refresh operation is required to periodically recharge the data stored in the memory cell. However, when a refresh operation is performed in DRAM in a device that is in standby mode, undesirable power consumption may occur.

To overcome the problem, a method of controlling a refresh operation in units of memory banks has been suggested. This method has been suggested to reduce power consumption by moving data that is scattered in various memory banks of a DRAM to a single memory bank and omitting to refresh empty memory banks.

However, the method requires power and time for movement of data between memory banks and has inefficiency in granularity since each memory bank is controlled independently. Additionally, it is desired to reduce power consumption caused by a refresh operation in DRAM in order to use DRAM.

SUMMARY

Some embodiments of the present inventive concept provide semiconductor memory devices with reduced self-refresh power consumption and refresh methods thereof.

According to some embodiments of the present inventive concept, there is provided a semiconductor memory device including a memory bank including a plurality of memory cells and a self-refresh controller coupled to the memory bank and configured to generate a refresh address and output a row address for a page to be refreshed based on the refresh address. The semiconductor memory device is configured to drive the memory bank based on the row address and to selectively refresh the page in the memory bank in response to the row address output by the self-refresh controller.

The self-refresh controller may include a column address counter configured to count information indicating whether to skip refresh of a page in the memory bank, a storage block configured to store the information counted by the column address counter and output a flag signal including the information, a self-refresh address generator configure to generate the refresh address in response to the information counted by the column address counter, and a self-refresh address selector configured to output the row address based on the refresh address and the flag signal.

The semiconductor memory device may decode the row address and output a signal for driving the memory bank.

According to other embodiments of the present inventive concept, there is provided a semiconductor memory device including a memory cell array including a plurality of word lines and a self-refresh controller coupled to the memory cell array and configured to control self-refresh of the memory cell array. The plurality of word lines may include at least one dummy word line. The at least one dummy word line may store refresh information about a word line to be refreshed among the plurality of word lines. The semiconductor memory device may perform self-refresh on the word line among the plurality of word lines based on the refresh information.

The self-refresh controller may include a self-refresh address generator configured to generate a refresh address and a self-refresh period decision block configured to receive the refresh address and determine a self-refresh period.

The semiconductor memory device may further include a buffer register configured to receive and store the refresh information.

The refresh information may be refresh information bitmapped.

The self-refresh period decision block decides a self-refresh period using the bitmapped refresh information.

The at least one dummy word line may be an outermost word line among the plurality of word lines.

According to further embodiments of the present inventive concept, there is provided a memory module including the above-described semiconductor memory device and a memory controller configured to control the semiconductor memory device.

A semiconductor memory device according to some embodiments of the inventive concept includes a memory bank comprising a plurality of memory pages, and a self-refresh controller coupled to the memory bank and configured to selectively control self-refresh of one or more memory pages in the plurality of memory pages in response to refresh information stored in the self-refresh controller and/or the memory bank that indicates pages in the memory bank that should be refreshed.

The self-refresh controller may be configured to generate a refresh address based on the refresh information and to output a row address for a page to be refreshed based on the refresh address.

The refresh information may be stored as bitmapped refresh information in the self-refresh controller and/or in a dummy word line in the memory bank.

In other embodiments, an electronic system includes the above-described memory module and a storage device configured to store an operating system and an application.

The storage device may include a large-capacity storage unit and/or a non-volatile memory.

The large-capacity storage unit may include a hard disk drive (HDD), a solid state drive (SSD), and/or a network-attached storage (NAS).

The non-volatile memory may include a flash memory, a phase-change random access memory (PRAM), and/or a magnetoresistive random access memory (MRAM).

BRIEF DESCRIPTION OF THE DRAWINGS

The above and other features and advantages of the present inventive concept will become more apparent by describing in detail exemplary embodiments thereof with reference to the attached drawings in which.

DETAILED DESCRIPTION OF EMBODIMENTS

Figure 1A:
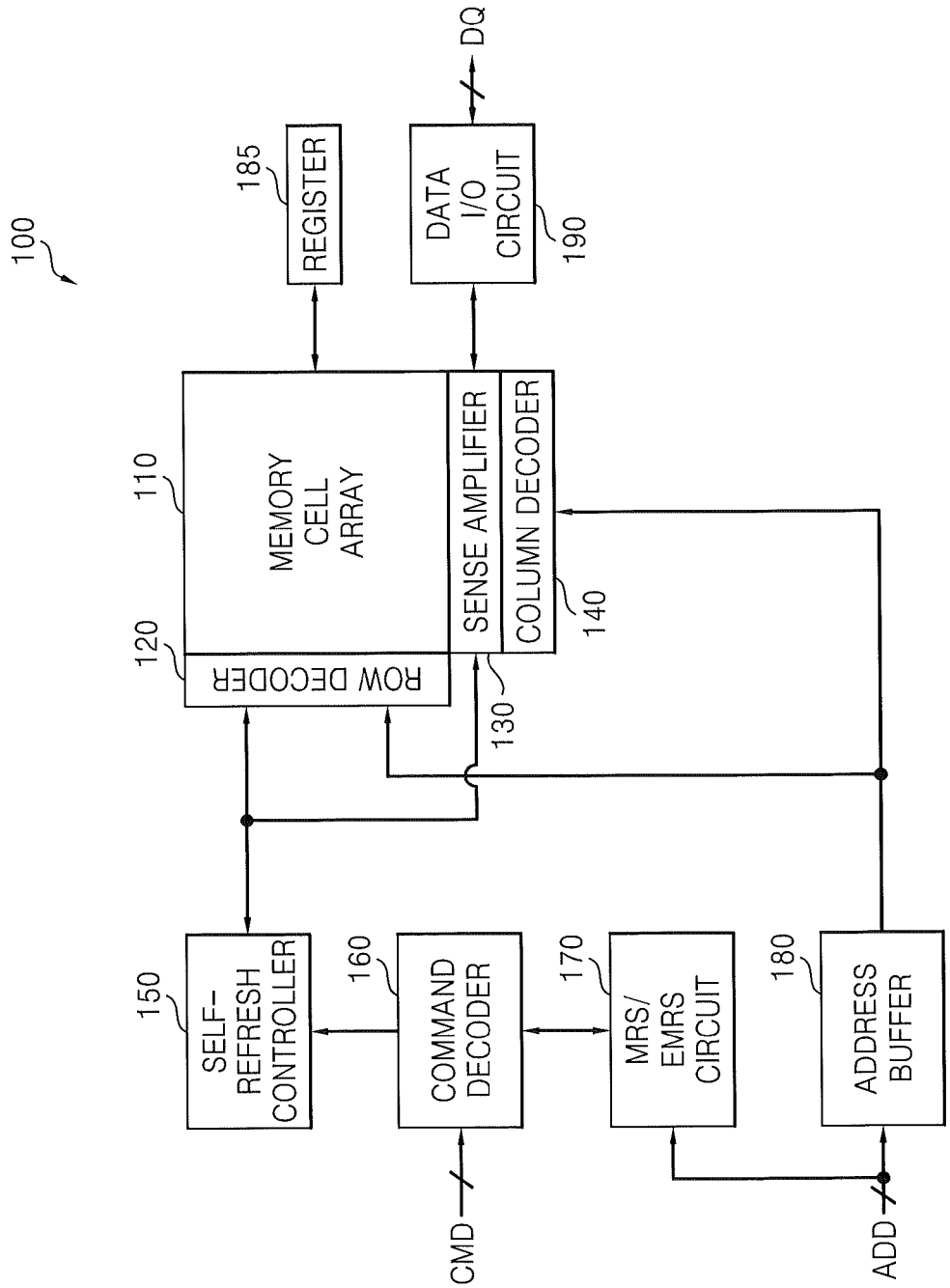
FIG. 1A is a block diagram of a semiconductor memory device according to some embodiments of the present inventive concept.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1A is a block diagram of a semiconductor memory device 100 according to some embodiments of the present inventive concept. Referring to FIG. 1A, the semiconductor memory device 100 includes a memory cell array 110, a row decoder 120, a sense amplifier 130, a column decoder 140, a self-refresh controller 150, a command decoder 160, a mode register set (MRS)/extended mode register set (EMRS) circuit 170, an address buffer 180, a register 185, and a data input/output (I/O) circuit 190. The operation of the semiconductor memory device 100 is described below.

The memory cell array 110 is a data storage in which a lot of memory cells are arranged in row and column directions. The sense amplifier 130 senses and amplifies data from a memory cell and writes data to the memory cell. The memory cell array 110 may include four memory banks (e.g., first through fourth memory banks), but the present invention is not restricted to cell arrays having four memory banks, but could be applied to cell memory arrays having any number of memory banks.

The memory cell array 110 may store software allowing the semiconductor memory device 100 to identify unnecessary pages and necessary pages using information within the semiconductor memory device 100 and to reduce the amount of memory in use when there are no unnecessary pages. In other words, the software extracts page information including skip information about whether to skip a refresh on the first, second, third, or fourth memory bank, bitmaps the page information, and stores the bitmapped page information in a specific reference region in the first, second, third or fourth memory bank. In addition, the software allows the semiconductor memory device 100 to reduce the amount of memory in use when there is no page information to be skipped in the first, second, third or fourth memory bank. The memory cell array 110 may also store a refresh period when the refresh is performed.

The first, second, third, or fourth memory bank performs a refresh on each page based on the bitmapped page information.

The register 185 stores page address information. For instance, the register 185 stores a start address of the specific reference region in the first, second, third, or fourth memory bank, in which the bitmapped page information generated by the software is stored. The page address information includes the start address.

Data DQ received through the data I/O circuit 190 is written to the memory cell array 110 based on an address signal ADD. The data DQ read from the memory cell array 110 based on the address signal ADD is output through the data I/O circuit 190. The address signal ADD is input to the address buffer 180 to designate a memory cell which data will be written to or read from. The address buffer 180 temporarily stores the address signal ADD received from an outside.

The row decoder 120 decodes a row address in the address signal ADD output from the address buffer 180 to designate a word line connected to a memory cell which data will be input to or output from. In other words, the row decoder 120 decodes the row address output from the address buffer 180 and enables a word line corresponding to the row address in a write or read mode. The row decoder 120 also decodes a row address generated by the self-refresh controller 150 in a self-refresh mode and enables a word line corresponding to the row address.

The column decoder 140 decodes a column address in the address signal ADD output from the address buffer 180 to designate a bit line connected to the memory cell which data will be input to or output from.

The memory cell array 110 reads data from or writes data to the memory cell designated by the row address and the column address.

The command decoder 160 receives a command signal CMD from an outside, decodes the command signal CMD, and generates a decoded command signal (e.g., a self-refresh start command or a self-refresh end command).

The MRS/EMRS circuit 170 sets an internal mode register in response to the address signal ADD and an MRS/EMRS command for designating an operation mode of the semiconductor memory device 100.

Although not shown in FIG. 1A, the semiconductor memory device 100 may also include a clock circuit (not shown) generating a clock signal and a power supply circuit (not shown) receiving a power supply voltage and generating or dividing an internal voltage.

The self-refresh controller 150 controls a self-refresh of the semiconductor memory device 100 in response to a command output from the decoded command signal command decoder 160.

Figure 1B:
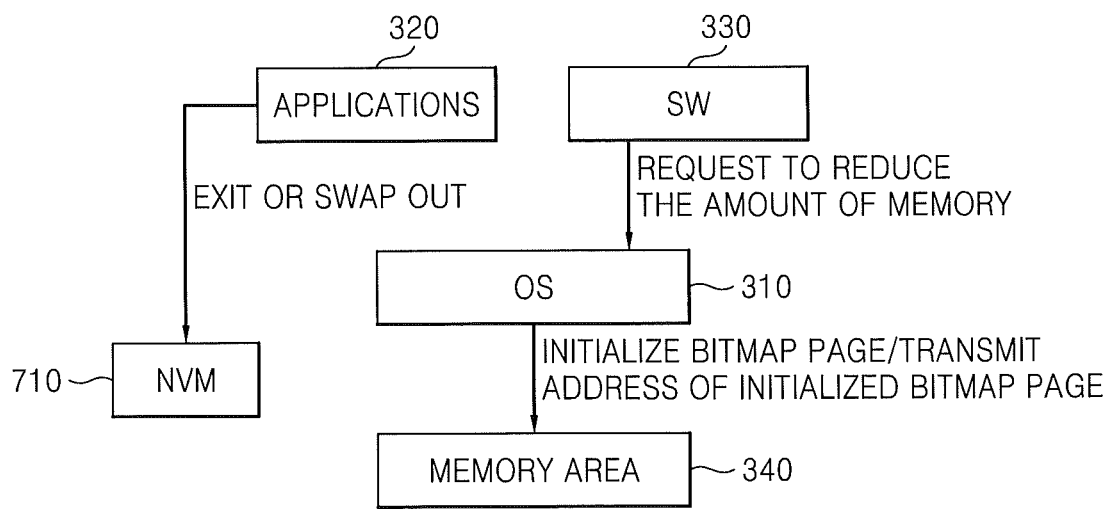
FIG. 1B is a diagram of the system environment of a semiconductor memory device according to some embodiments of the present inventive concept.
Figure 1C:
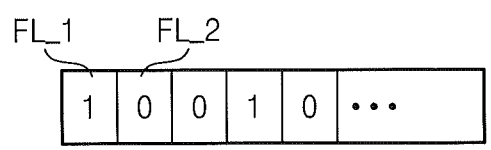
FIG. 1C is a diagram of a bitmap page of the semiconductor memory device.
Figure 1D:
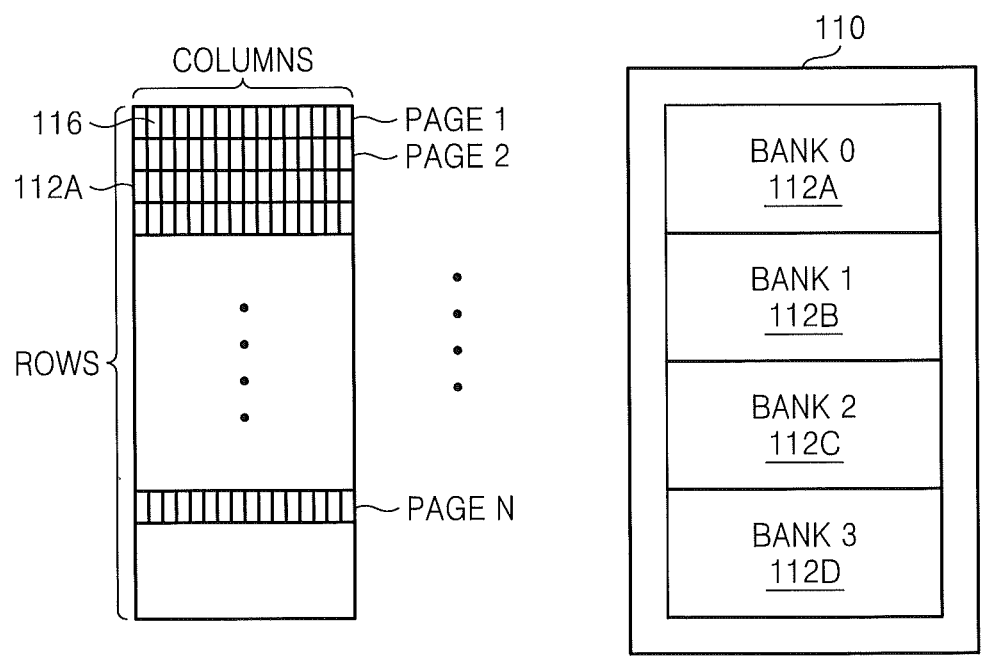
FIG. 1D is a diagram of a memory cell array of the semiconductor device.

FIG. 1B is a diagram of the system environment of a semiconductor memory device according to some embodiments of the present inventive concept. FIG. 1C is a diagram of a bitmap page of the semiconductor memory device. FIG. 1D is a diagram of a memory cell array of a device according to some embodiments of the inventive concept.

Referring to FIGS. 1B and 1C, a bitmap page in a memory area 340 may be initialized by an operating system (OS) 310 at system boot or thereafter. The memory area 340 may be a conceptual block corresponding to the memory cell array 110 or a portion thereof.

Referring to FIG. 1D, the memory cell array 110 may include a plurality of memory banks 112A to 112D. Each of the memory banks 112A to 112D includes memory cells 116 arranged in respective rows and columns that can be addressed by the row decoder 120 and the column decoder 140 shown in FIG. 1A. Each of the memory banks 112A to 112D includes a plurality of pages, PAGE 1 to PAGE N.

Referring again to FIG. 1C, the bitmap page is illustrated in FIG. 1C and is a page that exists in the memory area 340. The bitmap page stores flag indicating whether associated pages need a self-refresh. For instance, in case of a first flag FL_1, that is, when a flag for a page is 1, the page needs self-refresh. In case of a second flag FL_2, that is, when a flag for a page is 0, the page does not need self-refresh. However, the present invention is not restricted to this example. For instance, two or more flags may be used to indicate whether a single page needs the self-refresh. When multiple flags are used to indicated whether a single page needs self-refresh, the bitmap page can, for example, store more information about the type and/or frequency of refresh that is needed.

The OS 310 may transmit an address of the initialized bitmap page to the memory area 340. A software module (SW) 330 reduces the amount of memory used by a system before the system environment enters a suspended mode. For instance, the SW 330 may request the OS 310 to reduce the amount of memory in use and the OS 310 may exit or swap out at least one application 320 to a non-volatile memory (NVM) 710.

Figure 2:
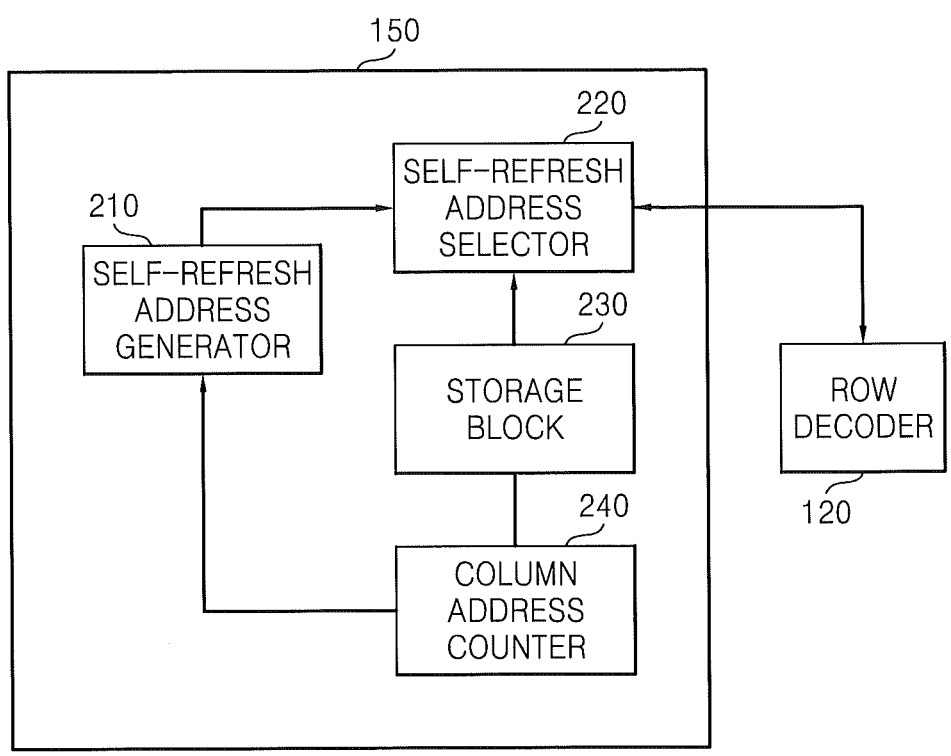
FIG. 2 is a diagram of a self-refresh controller illustrated in FIG. 1A according to some embodiments of the present inventive concept.

FIG. 2 is a diagram of the self-refresh controller 150 illustrated in FIG. 1A according to some embodiments of the present inventive concept. The self-refresh controller 150 includes a self-refresh address generator 210, a self-refresh address selector 220, a storage block 230, and a column address counter 240.

The column address counter 240 counts bits and pages from which information has been read_in the first, second, third or fourth memory bank and temporarily stores information counted in the storage block 230, which includes bitmapped information.

At this time, the column address counter 240 may refer to the start address stored in the register 185 illustrated in FIG. 1A or may perform counting via a block, such as a read control block (not shown), for memory reading to perform the refresh operation.

The storage block 230 outputs a flag signal including the bitmap information to the self-refresh address selector 220.

The self-refresh address generator 210 generates and outputs a refresh address to the self-refresh address selector 220. At this time, the self-refresh address generator 210 may generate the refresh address in response to count information received from the column address counter 240.

The self-refresh address selector 220 receives the refresh address from the self-refresh address generator 210 and the flag signal from the storage block 230 and outputs a row address including information about a page to be refreshed to the row decoder 120.

Figure 3:
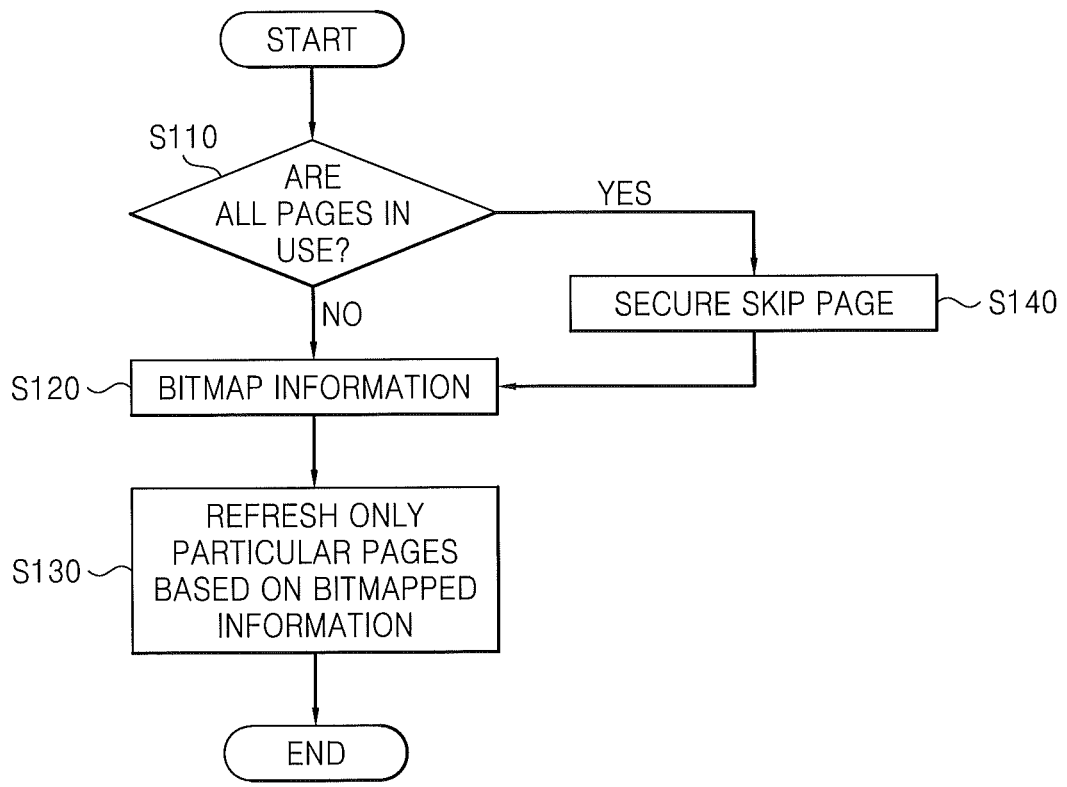
FIG. 3 is a flowchart of a refresh method of a semiconductor memory device according to some embodiments of the present inventive concept.
Figure 4:
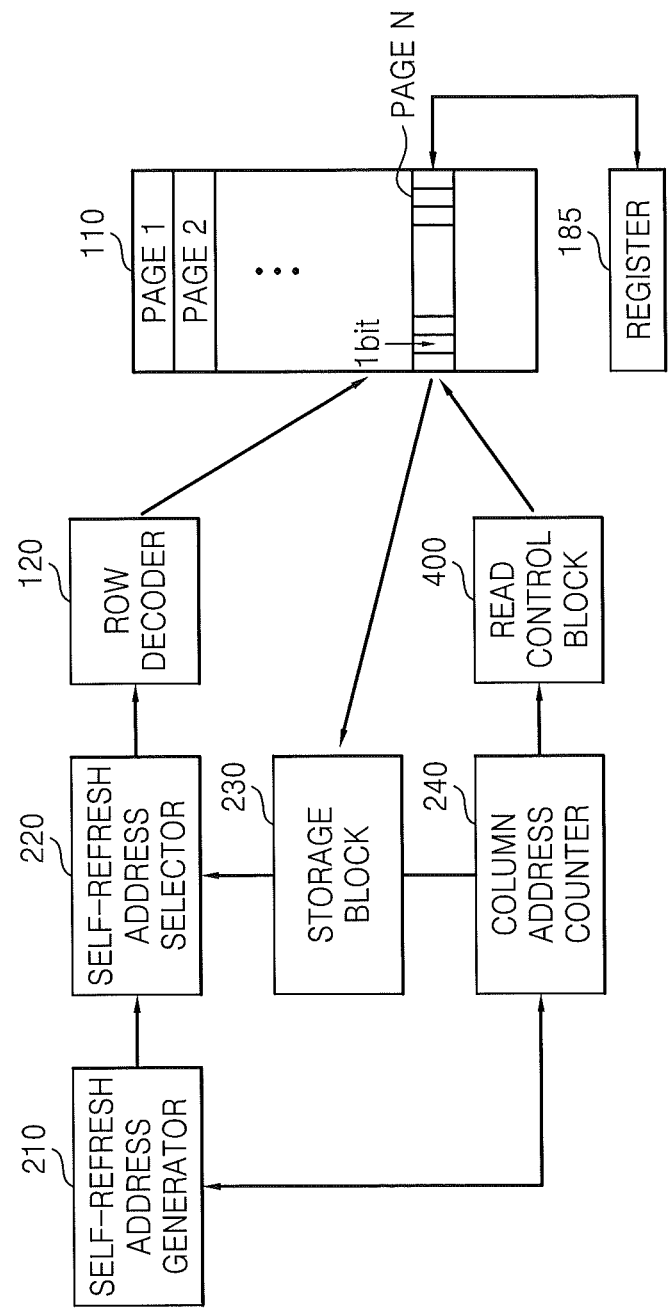
FIG. 4 is a conceptual diagram for supplementary explanation of the flowchart illustrated in FIG. 3.

FIG. 3 is a flowchart of refresh methods of the semiconductor memory device 100 according to some embodiments of the present inventive concept. FIG. 4 is a conceptual diagram for supplementary explanation of the flowchart illustrated in FIG. 3.

Referring to FIGS. 3 and 4, the semiconductor memory device 100 determines whether all pages in the first through fourth memory banks are in use in operation S110. If all pages are in use, a self-refresh will not be skipped on any page. The determination may be performed by the SW 330 illustrated in FIG. 1B, but the present invention is not restricted thereto.

If less than all pages are in use, page information (e.g., an N-th page, i.e., PAGE N) including skip information is extracted and bitmapped using the SW 330 in operation S120. At this time, the SW 330 stores the bitmapped page information in the specific reference region of the first, second, third or fourth memory bank. In this case, the register 185 stores a start address of the specific reference region of the first, second, third or fourth memory bank, in which the bitmapped page information is stored by the SW 330.

Next, only particular pages are refreshed based on the bitmapped page information in operation S130. At this time, the particular pages may be pages that have necessary information and the refresh may be performed when the semiconductor memory device 100 is in a self-refresh mode.

The refresh will be described in detail with reference to FIG. 4. The column address counter 240 counts bits and pages (e.g., the N-th page, i.e., PAGE N) from which information has been read in the first, second, third or fourth memory bank via a read control block 400 and stores information counted in the storage block 230, which is bitmapped information. The storage block 230 outputs a flag signal including the bitmap information to the self-refresh address selector 220. At this time, a refresh period for each page may be stored in the storage block 230.

The self-refresh address selector 220 outputs to the row decoder 120 a row address including information about a page to be refreshed based on a refresh address received from the self-refresh address generator 210 and the flag signal received from the storage block 230.

Here, the read control block 400 reads data from the first, second, third or fourth memory bank. The column address counter 240 may refer to the start address stored in the register 185 to perform the above-described function.

When all pages are in use, the semiconductor memory device 100 secures a skip page in operation S140 and moves to operation S120. Operation S140 will be described in detail below with reference to FIG. 5.

Consequently, only a particular page (e.g., a page having information needing to be retained) is refreshed in the first, second, third or fourth memory bank, so that power consumption may be reduced.

Figure 5:
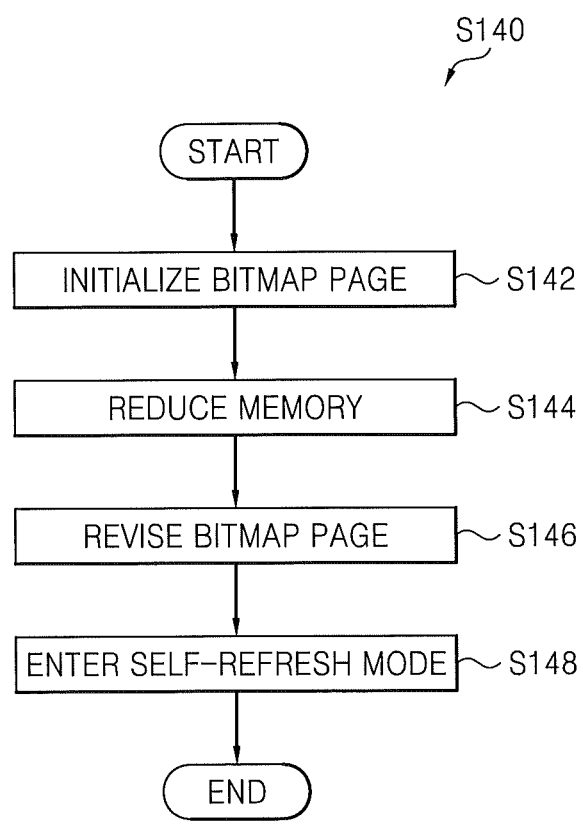
FIG. 5 is a flowchart of an operation of securing a skip page illustrated in FIG. 3.

FIG. 5 is a detailed flowchart of operation S140 illustrated in FIG. 3. FIG. 5 illustrates a procedure in which the semiconductor memory device 100 secures a skip page when all pages are in use.

Referring to FIG. 5, a bitmap page of the semiconductor memory device 100 is initialized by the OS 310 at system boot in operation S142. At this time, an address of the bitmap page is transmitted from the OS 310 to the semiconductor memory device 100. The OS 310 is stored in the NVM 710 illustrated in FIG. 12 or a large-capacity storage unit 720. The bitmap page is a page that exists in the semiconductor memory device 100 and stores a flag indicating necessity or non-necessity of a self-refresh.

The SW 330 reduces the amount of memory used by a system before the system enters a suspend mode in operation S144. In detail, when the system is in a swap-on mode, the SW 330 requests the OS 310 to reduce the amount of memory. The OS 310 swaps out applications 320, except for other applications that will not be swapped out, to the NVM 710 or the large-capacity storage unit 720. When the system is in a swap-off mode, the SW 330 exits at least one application 320 to reduce the amount of memory. At this time, the SW 330 may store the execution state of the application 320 before exiting the application 320. In addition, the SW 330 may force the at least one application 320 to end according to a predetermined condition.

Next, the SW 330 revises the bitmap page in operation S146. The bitmap page may be revised and stored in the semiconductor memory device 100 by mapping the bitmap page to an address space of the SW 330 or may be revised and stored through writing.

When the revision of the bitmap page is completed and the SW 330 enters a self-refresh mode, the semiconductor memory device 100 determines whether to skip the self-refresh with respect to each page based on the bitmap page and secures a skip page in operation S148.

Figure 6:
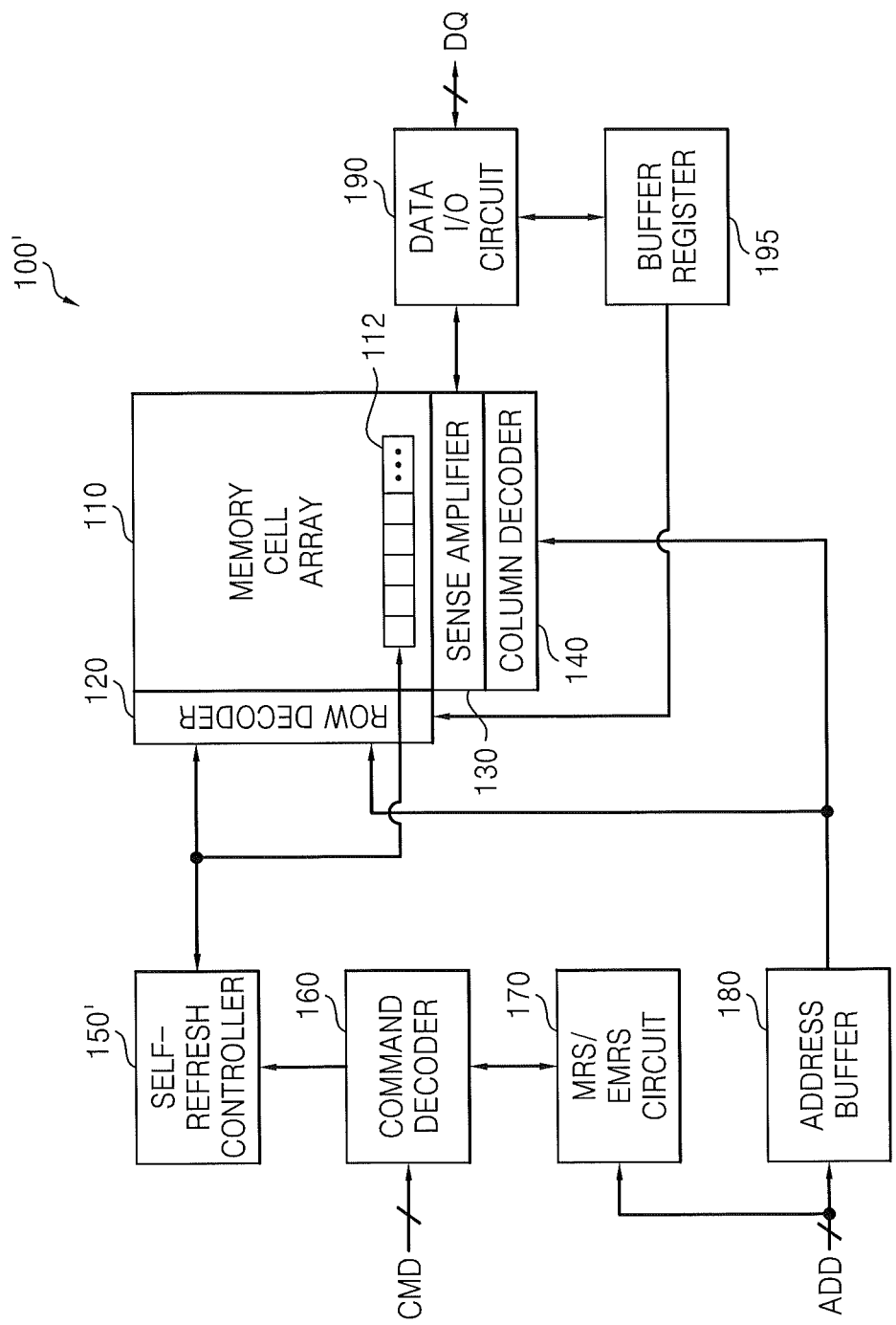
FIG. 6 is a block diagram of a semiconductor memory device according to other embodiments of the present inventive concept.

FIG. 6 is a block diagram of a semiconductor memory device 100' according to other embodiments of the present inventive concept. Referring to FIG. 6, the semiconductor memory device 100' includes the memory cell array 110, the row decoder 120, the sense amplifier 130, the column decoder 140, a self-refresh controller 150', the command decoder 160, the MRS/EMRS circuit 170, the address buffer 180, the data I/O circuit 190, and a buffer register 195. The operation of the semiconductor memory device 100' will be described schematically below.

The memory cell array 110 is a data storage in which a number of memory cells are arranged in row and column directions. The sense amplifier 130 senses and amplifies data from a memory cell and writes data to the memory cell. The memory cell array 110 may include four memory banks (e.g., first through fourth memory banks), but the present invention is not restricted thereto.

The semiconductor memory device 100' may identify word lines to be refreshed and word lines not to be refreshed and bitmap refresh information, which is about whether to refresh each word line. The bitmapped refresh information may be stored in a dummy word line 112. The dummy word line 112 may be included in the memory cell array 110.

A refresh may be performed on each word line based on the bitmapped refresh information in the first through fourth memory banks. For instance, the first and second word lines may not be refreshed while the third word line is refreshed.

Data DQ received through the data I/O circuit 190 is written to the memory cell array 110 based on an address signal ADD. The data DQ read from the memory cell array 110 based on the address signal ADD is output through the data I/O circuit 190.

The address signal ADD is input to the address buffer 180 to designate a memory cell which data will be written to or read from. The address buffer 180 temporarily stores the address signal ADD received from an outside.

The buffer register 195 receives the bitmapped refresh information through the data I/O circuit 190 and stores it. The buffer register 195 may output the bitmapped refresh information to the row decoder 120 or the self-refresh controller 150.

The row decoder 120 decodes a row address in the address signal ADD output from the address buffer 180 to designate a word line connected to a memory cell which data will be input to or output from.

In other words, the row decoder 120 decodes the row address output from the address buffer 180 and enables a word line corresponding to the row address in a write or read mode. The row decoder 120 also enables the word lines to be refreshed based on the row address generated by the self-refresh controller 150 and the bitmapped refresh information in a self-refresh mode.

The column decoder 140 decodes a column address in the address signal ADD output from the address buffer 180 to designate a bit line connected to the memory cell which data will be input to or output from.

The memory cell array 110 reads data from or writes data to the memory cell designated by the row address and the column address.

The command decoder 160 receives a command signal CMD from an outside, decodes the command signal CMD, and generates a decoded command signal (e.g., a self-refresh start command or a self-refresh end command).

The self-refresh controller 150' receives a decoded command signal from the command decoder 160 and controls a self-refresh of the memory cell array 110. The self-refresh controller 150' will be described in detail with reference to FIG. 7 later.

The MRS/EMRS circuit 170 sets an internal mode register in response to the address signal ADD and an MRS/EMRS command for designating an operation mode of the semiconductor memory device 100.

Although not shown in FIG. 6, the semiconductor memory device 100' may also include a clock circuit (not shown) generating a clock signal and a power supply circuit (not shown) receiving a power supply voltage and generating or dividing an internal voltage.

Figure 7:
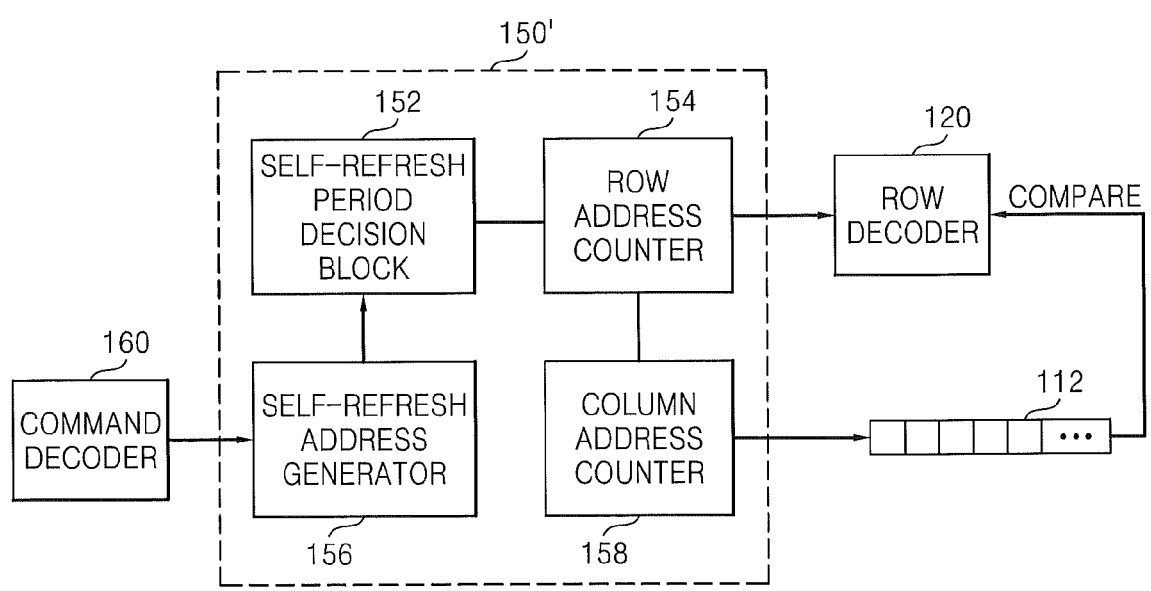
FIG. 7 is a detailed diagram of a self-refresh controller illustrated in FIG. 6.

FIG. 7 is a detailed diagram of the self-refresh controller 150' illustrated in FIG. 6. Referring to FIG. 7, the self-refresh controller 150' includes a self-refresh period decision block 152, a row address counter 154, a self-refresh address generator 156, and a column address counter 158.

When receiving a self-refresh start command from the command decoder 160, the self-refresh address generator 156 generates a refresh address and outputs it to the self-refresh period decision block 152.

The self-refresh period decision block 152 receives the refresh address and decides a self-refresh period. For instance, the self-refresh period decision block 152 may compare row address information increased by the row address counter 154 with the bitmapped refresh information in the buffer register 195 (or in the dummy word line 112) to decide a self-refresh period for each word line.

When the self-refresh period is decided for each word line, a word line among a plurality of word lines is decided to be refreshed.

In detail, the bitmapped refresh information includes information about a word line needing to be refreshed or information about a word line not needing to be refreshed, and therefore, only word lines needing to be refreshed can be refreshed according to a result of the comparison.

The row address counter 154 outputs a row address including information about a word line to be refreshed to the row decoder 120.

The column address counter 158 increases a column address and may enable the bitmapped refresh information stored in the dummy word line 112 to be input to and/or output from the buffer register 195.

Figure 8:
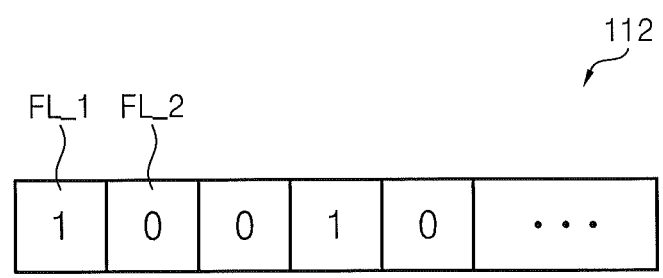
FIG. 8 is a diagram of a dummy word line storing bit-mapped information in a semiconductor memory device according to some embodiments of the present inventive concept.

FIG. 8 is a diagram of the dummy word line 112 storing bitmapped information in the semiconductor memory device 100' according to some embodiments of the present inventive concept. The dummy word line 112 illustrated in FIG. 8 may be a conceptual block used to explain the embodiments of the present inventive concept.

The dummy word line 112 is a kind of word line included in the memory cell array 110 and may be positioned at the outermost part of a word line array, but the present invention is not restricted to the current embodiments.

The dummy word line 112 stores a flag indicating whether each word line needs a self-refresh. For instance, when in case of a first flag FL_1, that is, when a flag for a word line is 1, the word line needs the self-refresh. In case of a second flag FL_2, that is, when a flag for a word line is 0, the word line does not need the self-refresh. However, the present invention is not restricted to this example. For instance, two or more (e.g., 10 or 100) flags may be used to indicate whether a single page (e.g., one or more word lines) needs the self-refresh.

Figure 9A:
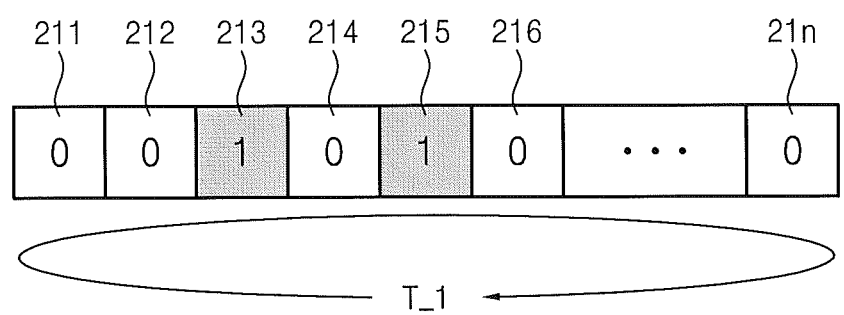
FIG. 9A is a diagram for explaining a self-refresh period in a comparison example.
Figure 9B:
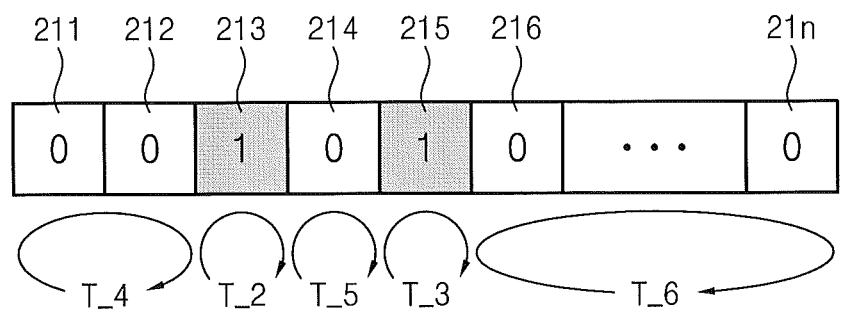
FIG. 9B is a diagram for explaining a self-refresh period according to some embodiments of the present inventive concept.

FIG. 9A is a diagram for explaining a self-refresh period in a comparison example. FIG. 9B is a diagram for explaining a self-refresh period according to some embodiments of the present inventive concept.

Referring to FIGS. 6, 9A, and 9B, the buffer register 195 may include a plurality of blocks 211 through 21$n$ shown in FIGS. 9A and 9B. A flag (e.g., "0" or "1") indicating necessity or non-necessity of a self-refresh may be stored in each of the blocks 211 through 21$n$.

A first period T_1, which is the self-refresh period in the comparison example illustrated in FIG. 9A, is a period during which all word lines are refreshed regardless information about word lines needing a refresh or information about word lines not needing a refresh.

At this time, the blocks 211 through 21$n$ include the blocks 213 and 215 each including information about a word line needing a refresh and the blocks 211, 212, 214, and 216 through 21$n$ each including information about a word line not needing a refresh.

Unlike the self-refresh period illustrated in FIG. 9A, the self-refresh period illustrated in FIG. 9B is the sum of a second period T_2 and a third period T_3. The second period T_2 corresponds to a period of time taken to refresh a word line corresponding to the block 213 including information about the word line needing a refresh. The third period T_3 corresponds to a period of time taken to refresh a word line corresponding to the block 215 including information about the word line needing a refresh.

When a word line corresponding to each of the blocks 211, 212, 214, and 216 through 21$n$ each including information about the word line not needing a refresh needs to be refreshed in a subsequent round, the word line is refreshed. For instance, when all of the word lines respectively corresponding to the blocks 211, 212, 214, and 216 through 21$n$ need to be refreshed in the subsequent round, the word lines corresponding to the consecutive blocks 211 and 212 or 216 through 21$n$ may be refreshed in a single period. Accordingly, the self-refresh period in the subsequent round may be the sum of a fourth period T_4, a fifth period T_5, and a sixth period T_6.

Figure 10:
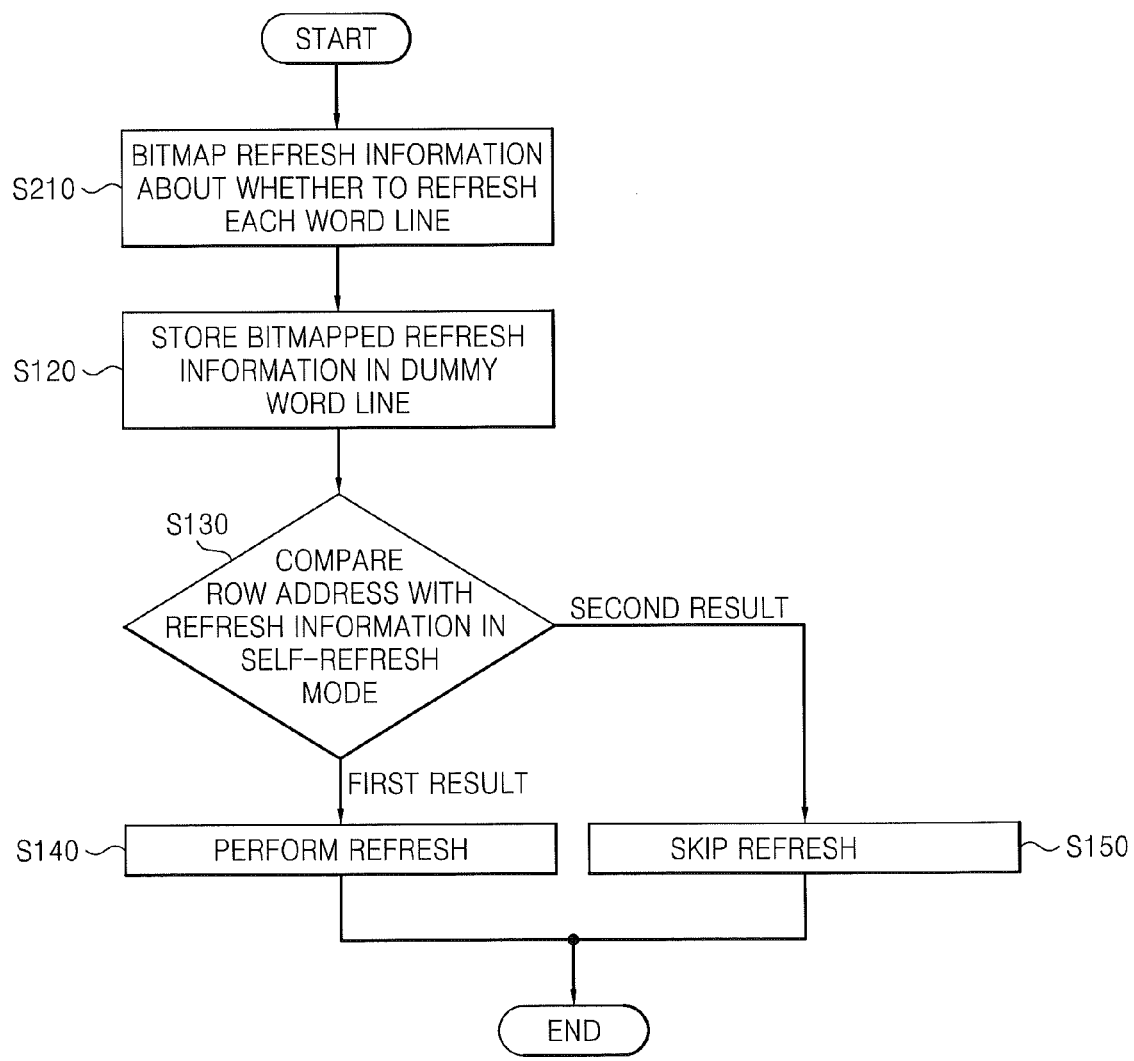
FIG. 10 is a flowchart of a refresh method of a semiconductor memory device according to other embodiments of the present inventive concept.

FIG. 10 is a flowchart of a refresh method according to other embodiments of the present inventive concept. The refresh method illustrated in FIG. 10 may be performed by the semiconductor memory device 100' illustrated in FIG. 6.

Referring to FIG. 10, the semiconductor memory device 100' bitmaps refresh information about whether to refresh each word line in operation S210. The refresh information includes information about word lines needing a refresh and information about word lines not needing a refresh.

The semiconductor memory device 100' stores the bitmapped refresh information in the dummy word line 112 included in the memory cell array 110 in operation S220. The semiconductor memory device 100' compares a row address with the refresh information in a self-refresh mode in operation S230. When a comparison result is a first result, that is, when the row address matches up with the refresh information, e.g., information about word lines needing a refresh, the semiconductor memory device 100' performs the refresh in operation S240.

When the comparison result is a second result, that is, when the row address matches up with the refresh information, e.g., information about word lines not needing a refresh, the semiconductor memory device 100' skips the refresh in operation S250.

According to the refresh method, only word lines needing a refresh are refreshed, and therefore, refresh power is reduced. In addition, a refresh period is extended according to the characteristics of word lines, so the refresh power is further reduced.

Figure 11:
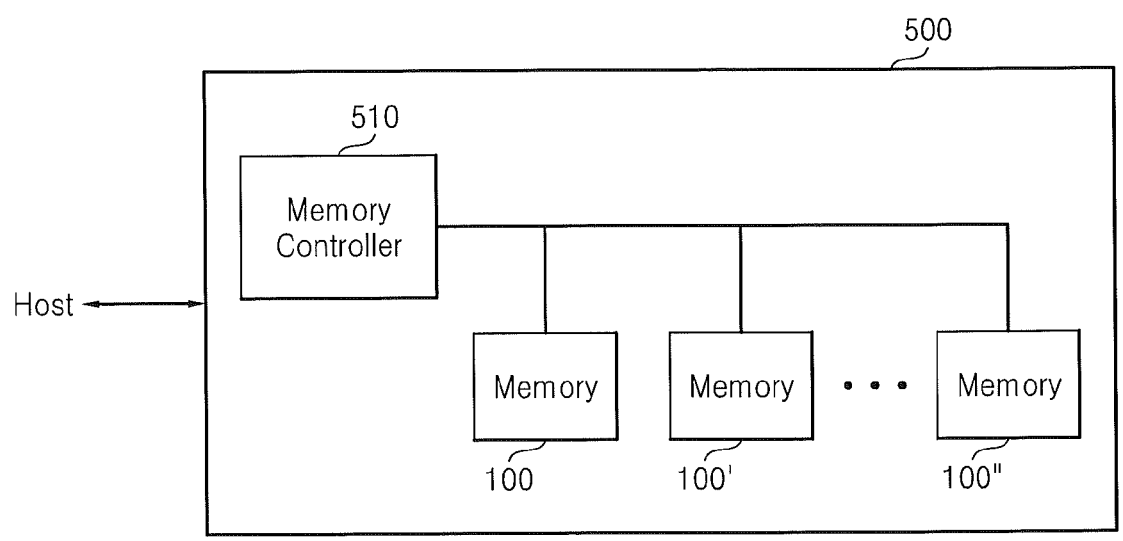
FIG. 11 is a schematic block diagram of a non-volatile memory module according to an embodiment of the invention.

FIG. 11 is a schematic block diagram of a memory module 500 according to an embodiment of the inventive concept.

The memory module 500 comprises a plurality of the semiconductor memory devices 100, 100', and 100" and a memory controller 510 controlling the semiconductor memory devices 100, 100', and 100". Each of the semiconductor memory devices 100, 100', and 100" may be the memory device 100 illustrated in FIG. 1. Detailed descriptions about configurations and operations of the memory devices 100, 100', and 100" will be thus omitted.

The memory device 100, 100', and 100" and/or the memory controller 510 according to some embodiments of the present inventive concept may be packed in various types of packages. For example, the various packages may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

The memory devices 100, 100', and 100" and the memory controller 510 may form a memory card. At this time, the memory controller 510 may be designed to communicate with an external device, e.g., a host, using one of various interface protocols such as universal serial bus (USB), multimedia card (MMC), a peripheral component interconnect express (PCI-E), serial ATA (SATA), parallel ATA (PATA), small computer system interface (SCSI), enhanced small disk interface (ESDI), and integrated drive electronics (IDE).

The memory module according to an embodiment of the inventive concept may be embedded in the electronic system such as mobile devices, laptop computers, or desktop computers. Some examples of the electronic system are illustrated in FIG. 12.

Figure 12:
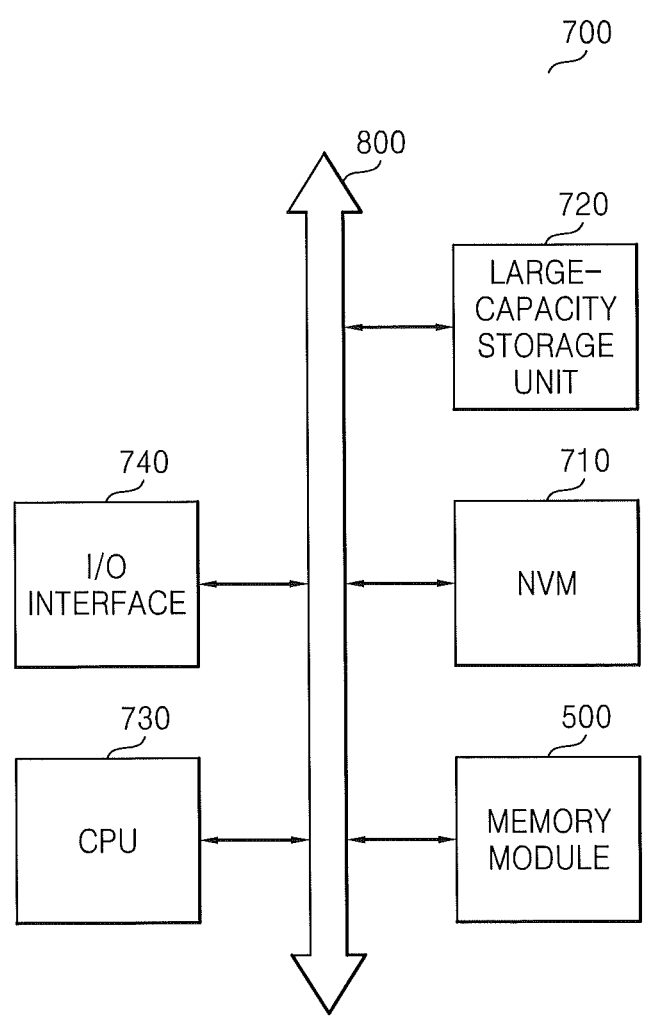
FIG. 12 is a block diagram of an electronic system according to an embodiment of the inventive concept.

Referring to FIG. 12, the electronic system 700 comprises a memory module 500, a non-volatile memory 710, a mass storage device 720, a central processing unit (CPU) 730, an I/O (Input/Output) interface 740, and a system bus 750 electrically connecting these elements.

The non-volatile memory 710 may include a flash memory, PRAM (Phase-change RAM), FRAM (ferroelectrics RAM), MRAM (Magnetoresistive RAM), and/or RRAM (Resistive RAM). The mass storage device 720 may include a SSD (solid state drive), a HDD (hard disk drive) and/or a NAS (Network-attached storage). The non-volatile memory 710 or the mass storage device 720 may store source files of a system OS and application programs.

When a system OS and application programs runs, the files may reside in the memory devices 100. In this case, the files may dispersively reside in a plurality of memory banks of the memory devices 100. The I/O interface 740 may be connected to a network port which connected with a network, or directly connected to a network.

The CPU 730 may control the operation of the memory module 500. According to control of The CPU 730, the memory devices 100 may execute commands that The RAM 930 stores information needed for the operation of the electronic system 900. The user interface 940 provides an interface between the electronic system 900 and a user. The power supply 910 supplies electric power to the internal constituent elements such as the CPU 920, the RAM 930, the user interface 940, and the memory module 500.

The flash memory 520 stores the N-bit data, where N is 1 or an integer greater than 1, that is provided through the user interface 940 or processed or will be processed by the CPU 920, via the memory controller 510.

The memory module 500 according to an embodiment of the inventive concept is as described above. A detailed description thereof will be thus omitted.

Although the memory device 520 and the memory controller 510 may together constitute a single memory card, the memory device 520 and the memory controller 510 may be separately embodied. The memory controller and the flash memory may constitute, for example, a solid state drive/disk (SSD) using a non-volatile memory for storing data. The memory controller 510 may be embodied in a host.

Although it is not illustrated in the drawings, the electronic system 900 or 900' may be further provided with application chipsets, camera image processors (CISs), or mobile DRAMs, which is well known to one skilled in the art to which the present inventive concept pertains.

The non-volatile memory operation method according to certain embodiments of the inventive concept can also be embodied in hardware, software, firmware or combination thereof. When the method is embodied in software, it can be embodied as computer readable codes or programs on a computer readable recording medium. The computer readable recording medium is any data storage device that can store data which can be thereafter read by a computer system. Examples of the computer readable recording medium may include read-only memory (ROM), random-access memory (RAM), electrically erasable programmable ROM (EEPROM), and flash memory.

As described above, according to some embodiments of the present inventive concept, self-refresh power is reduced and interleaving between memory banks is possible, so that the performance of a semiconductor memory device is increased. Since the self-refresh power is reduced, DRAM can be used in mobile electronic products such as smart phones.

While the present invention has been particularly shown and described with reference to exemplary embodiments thereof, it will be understood by those of ordinary skill in the art that various changes in forms and details may be made therein without departing from the spirit and scope of the present inventive concept as defined by the following claims.

What is claimed is:

1. A semiconductor memory device comprising:
   a memory bank comprising a plurality of memory cells; and
   a self-refresh controller coupled to the memory bank and configured to generate a refresh address and output a row address for a page to be refreshed based on the refresh address;
   wherein the semiconductor memory device is configured to drive the memory bank based on the row address and to selectively refresh the page in the memory bank in response to the row address output by the self-refresh controller;
   wherein the self-refresh controller comprises a column address counter configured to count information indicating whether to skip refresh of a page in the memory bank, a self-refresh address generator configured to generate the refresh address in response to the information counted by the column address counter, and a self-refresh address selector configured to output the row address based on the refresh address.

2. The semiconductor memory device of claim 1, wherein the self-refresh controller comprises:

a storage block configured to store the information counted by the column address counter and output a flag signal comprising the information;

wherein the self-refresh address selector is configured to output the row address based on the refresh address and the flag signal.

3. The semiconductor memory device of claim 2, further comprising a row decoder coupled to the refresh controller and configured to decode the row address and output a signal for driving the memory bank.

4. The semiconductor memory device of claim 2, further comprising a register configured to store page address information of the memory bank, wherein the self-refresh controller generates the refresh address in response to the page address information.

5. The semiconductor memory device of claim 4, wherein the page address information comprises a start address of a reference region in the memory bank.

6. The semiconductor memory device of claim 2, wherein the storage block stores the information as bitmap information, and wherein the memory bank refreshes each page based on the bitmap information.

7. A semiconductor memory device comprising:
a memory cell array comprising a plurality of word lines; and
a self-refresh controller coupled to the memory cell array and configured to control self-refresh of the memory cell array,
wherein the plurality of word lines comprise at least one dummy word line,
the at least one dummy word line stores refresh information about a word line to be refreshed among the plurality of word lines, and
the semiconductor memory device performs self-refresh on the word line among the plurality of word lines based on the refresh information.

8. The semiconductor memory device of claim 7, wherein the self-refresh controller comprises:
a self-refresh address generator configured to generate a refresh address; and
a self-refresh period decision block configured to receive the refresh address and determine a self-refresh period for a memory page associated with the refresh address.

9. The semiconductor memory device of claim 7, further comprising a buffer register configured to receive the refresh information and store the refresh information as bitmapped information.

10. The semiconductor memory device of claim 7, wherein the refresh information comprises information indicating whether to refresh each word line.

11. The semiconductor memory device of claim 8, wherein the self-refresh period decision block determines the self-refresh period using the bitmapped refresh information.

12. The semiconductor memory device of claim 7, wherein the at least one dummy word line comprises an outermost word line among the plurality of word lines.

13. A memory module comprising:
the semiconductor memory device of claim 7; and
a memory controller configured to control the semiconductor memory device.

14. An electronic system comprising:
the memory module of claim 13; and
a storage device configured to store an operating system and an application.

15. The electronic system of claim 14, wherein the storage device comprises a large-capacity storage unit and/or a non-volatile memory.

16. A semiconductor memory device comprising:
a memory bank comprising a plurality of memory pages; and
a self-refresh controller coupled to the memory bank and configured to selectively control self-refresh of one or more memory pages in the plurality of memory pages in response to refresh information stored in the self-refresh controller and/or the memory bank that indicates pages in the memory bank that should be refreshed;
wherein the refresh information is stored as bitmapped refresh information in a dummy word line in the memory bank.

17. The semiconductor memory device of claim 16, wherein the self-refresh controller is configured to generate a refresh address in response to the refresh information and to output a row address for a page to be refreshed based on the refresh address.

18. The semiconductor memory device of claim 17, wherein the row address is based on the refresh address and a flag signal indicating whether pages need a self-refresh.

19. The semiconductor memory device of claim 16, wherein the refresh information is stored as bitmapped refresh information in the self-refresh controller.

* * * * *